United States Patent
Katzir et al.

(10) Patent No.: US 11,894,480 B2
(45) Date of Patent: Feb. 6, 2024

(54) LOW LEAKAGE CURRENT GERMANIUM-ON-SILICON PHOTO-DEVICES

(71) Applicant: TriEye Ltd., Tel Aviv (IL)

(72) Inventors: Eran Katzir, Jerusalem (IL); Vincent Immer, Zichron-Yaakov (IL); Omer Kapach, Jerusalem (IL); Avraham Bakal, Tel Aviv (IL); Uriel Levy, Kiryat-Ono (IL)

(73) Assignee: TriEye Ltd., Tel Aviv (IL)

( * ) Notice: Subject to any disclaimer, the term of this patent is extended or adjusted under 35 U.S.C. 154(b) by 141 days.

(21) Appl. No.: 17/429,500

(22) PCT Filed: May 4, 2019

(86) PCT No.: PCT/IB2019/053661
§ 371 (c)(1),
(2) Date: Aug. 9, 2021

(87) PCT Pub. No.: WO2020/225588
PCT Pub. Date: Nov. 12, 2020

(65) Prior Publication Data
US 2022/0131024 A1    Apr. 28, 2022

(51) Int. Cl.
| H01L 31/109 | (2006.01) |
| H01L 31/0312 | (2006.01) |
| H01L 31/18 | (2006.01) |
| H01L 31/028 | (2006.01) |
| H01L 31/103 | (2006.01) |

(52) U.S. Cl.
CPC .......... *H01L 31/109* (2013.01); *H01L 31/028* (2013.01); *H01L 31/03125* (2013.01); *H01L 31/1812* (2013.01); *H01L 31/103* (2013.01)

(58) Field of Classification Search
CPC ................. H01L 31/109; H01L 31/028; H01L 31/03125; H01L 31/1812; H01L 31/103; H01L 31/1808; H01L 31/1105
See application file for complete search history.

(56) References Cited

U.S. PATENT DOCUMENTS 7,361,528 B2    4/2008    Lee et al.
9,799,756 B1    10/2017    Chan et al.

FOREIGN PATENT DOCUMENTS

EP    1116269 B1    12/2008

OTHER PUBLICATIONS

Olubuyide, "Low pressure epitaxial growth, fabrication and characterization of Ge-on-Si photodiodes" 2007. https://dspace.mit.edu/handle/1721.1/38685.

(Continued)

*Primary Examiner* — Calvin Y Choi
(74) *Attorney, Agent, or Firm* — Nathan & Associates; Menachem Nathan

(57) ABSTRACT

Germanium (Ge)-Silicon (Si) structures, optoelectronic devices and method for forming same. A structure comprises a Si substrate, a Ge seed layer and a Ge epitaxial layer separated by respective interfaces that share a common plane normal, wherein the Si substrate and the Ge seed layer have a same first doping type with a first doping level, and a locally doped region formed in the Si layer adjacent to the Ge seed layer and having a second doping type with a second doping level, wherein the locally doped region is designed to reduce leakage currents between the Si substrate and the Ge epitaxial layer when an electrical bias is applied to the structure.

19 Claims, 4 Drawing Sheets

(56) References Cited

OTHER PUBLICATIONS

Kang et al: "Monolithic germanium/silicon avalanche photodiodes with 340&160;GHz gain&8211 ;bandwidth product", Nature Photonics, vol. 3, No. 1, Dec. 7, 2008 (Dec. 7, 2008), pp. 59-63, XP055550997, London ISSN: 1749-4885, DOI: 10.1038/nphoton. 2008.247.
European Search Report in related EP patent application 19928044. 7, dated Apr. 22, 2022. 8 pages.
International Search Report. 9 pages, dated Sep. 16, 2021.

LOW LEAKAGE CURRENT GERMANIUM-ON-SILICON PHOTO-DEVICES

CROSS REFERENCE TO RELATED APPLICATIONS

This is a 371 from international application PCT/IB2019/053661 filed May 4, 2019.

FIELD

Embodiments disclosed herein relate in general to germanium (GE)-on-silicon (Si) photo-devices (also referred to as "optoelectronic" devices) and more particularly to structures and methods of reducing leakage currents in such photo-devices.

BACKGROUND

Ge-on-Si microelectronic devices (e.g. diodes and transistors) and optoelectronic devices (e.g. photodiodes) are known. The high carrier mobility in Ge compared to that in Si is advantageous for high-speed electronics. Furthermore, the ability of Ge to absorb light in the infrared band of 1000 to 1600 nm (also referred to as the short wave infrared or "SWIR" band) led to the development of Ge-based devices on the telecommunication and infrared (IR) imaging markets. With the development of various epitaxial Ge deposition/growth methods such as chemical vapor deposition (CVD), an interest in the integration of Ge materials in complementary metal oxide semiconductor (CMOS) circuit technology has developed.

In CVD of Ge on Si, due to high lattice mismatch of around 4.2% between Si and Ge, the surface tension causes the Ge lattice to develop high a treading dislocation density (TDD), which degrades device performance. Various methods to suppress the high TDD during growth have been proposed. Known methods include growing a graded buffer layer of $Si_xGe_{1-x}$ alloy material between the Ge and the Si, varying Ge growth parameters, and using a Ge seed layer. The latter involves the patterning and etching of an insulator (e.g. a $SiO_2$ layer) that covers the silicon substrate, exposing only small portion of the Si wafer (defined as "seed region") to the CVD growth of Ge seed-like structures. The patterning and etching of the $SiO_2$ causes epitaxial lateral overgrowth of Ge layers outside of the Ge seed area. As the threading dislocations are not parallel to the growth direction, this process forces them to glide from the Si/Ge interface to the edge of the oxide, and to annihilate them in the seed region, allowing the Ge overgrowth to be relatively free from threading dislocations. This in turn enhances the electrical properties of the device.

The use of variously known techniques as above still leaves Ge-on-Si devices with leakage (or "parasitic") currents that diminish device performance. When the seed is grown directly on the Si wafer, there is no barrier for carrier movement from the Si to the seed and vice versa, and thus there is carrier transport in the seed. In many Ge devices formed on a Si carrier wafer, the Si carrier wafer is biased to ground and a leakage of carriers can be transported through the seed into the Ge layer and can be measured as an undesired transport current.

Therefor there is a need for, and it would be advantageous to have structures and methods that minimize or completely block the leakage current and which separate electrically the Si and Ge layers in Ge-on-Si photo-devices.

SUMMARY

Embodiments disclosed herein teach structures that block leakage currents at the Ge/Si seed interface and separate electrically the Ge layer for the Si substrate (wafer), and methods for their formation and use. In an embodiment, the Si substrate is doped locally prior to Ge epitaxial layer growth (in an area to be referred to henceforth as a "locally doped Si region"). The local doping is of opposite type to that of the Si substrate as well as to that of the Ge seed. For example, if the Si substrate and the Ge seed are N doped, then the locally doped Si region is P doped. For example, if the Si substrate and the Ge seed are P doped, then the locally doped Si region is N doped. The doping in the Ge seed and the intermediate layer may be uniform or non-uniform (varying). The structure formed locally (in the Ge seed area) is thus similar to that of a bipolar junction transistor (BJT) with two "back-to-back" (or "head-to-head") diodes. That is, this "local" structure in the Ge seed area includes a PN (or NP) junction connected to a NP (or PN) junction in series. When a voltage is applied between the seed layer and the substrate (and through the locally doped Si region), it reduces the barrier of one junction but increases the barrier of the other junction, resulting in current blocking. Consequently, the undesired leakage current can be reduced, especially when the Ge epitaxial layer is designed to be part of an optoelectronic component such as a photodiode (PD), in which the leakage current is a "dark" current that needs to be reduced as much as possible. The advantage of this structure and its method of use is in the reduced sensitivity of the dark current on voltage polarity, where there is always one junction in reverse bias mode, in contrast with a single standard PN junction where the behavior of the junction is less controlled and where the energy barrier depends on the voltage polarity.

In exemplary embodiments, there are provided semiconductor structures comprising: a Si substrate, a Ge seed layer and a Ge epitaxial layer separated by respective interfaces that share a common plane normal, wherein the Si substrate and the Ge seed layer have a same first doping type with a first doping level; and a locally doped region formed in the Si layer adjacent to the Ge seed layer and having a second doping type with a second doping level, wherein the locally doped region is designed to reduce leakage currents between the Si substrate and the Ge epitaxial layer when an electrical bias is applied to the structure.

In exemplary embodiments, there are provided optoelectronic devices comprising: a Si substrate, a Ge seed layer and a Ge epitaxial layer separated by respective interfaces that share a common plane normal, wherein the Si substrate and the Ge seed layer have a same first doping type with a first doping level; and a locally doped region formed in the Si layer adjacent to the Ge seed layer and having a second doping type with a second doping level, wherein the locally doped region is designed to reduce leakage currents between the Si substrate and the Ge epitaxial layer when an electrical bias is applied to the structure; and biasing means for applying the electrical bias between the Si substrate and the Ge epitaxial layer.

In exemplary embodiments, there are provided methods comprising: forming a structure comprising a Si substrate, a Ge seed layer and a Ge epitaxial layer separated by respective interfaces that share a common plane normal, wherein the Si substrate and the Ge seed layer have a same first doping type with a first doping level; and a locally doped region formed in the Si layer adjacent to the Ge seed layer and having a second doping type with a second doping level, wherein the locally doped region is designed to reduce leakage currents between the Si substrate and the Ge epitaxial layer when an electrical bias is applied to the structure.

In some embodiments, a method further comprises forming biasing means for applying the electrical bias between the Si substrate and the Ge epitaxial layer.

In some of the structures and optoelectronic devices, the first doping type is n-type and wherein the second doping type is p-type.

In some of the structures and optoelectronic devices, the first doping type is p-type and wherein the second doping type is n-type.

In some of the structures and optoelectronic devices, the Ge epitaxial layer has a doping type that is the same as the first doping type.

In some of the structures and optoelectronic devices, the Ge epitaxial layer has intrinsic doping.

In some of the structures and optoelectronic devices, the second doping level is higher than the first doping level.

In general, optoelectronic devices disclosed herein are useful for light detection in the SWIR range.

BRIEF DESCRIPTION OF THE DRAWINGS

Non-limiting examples of embodiments disclosed herein are described below with reference to figures attached hereto that are listed following this paragraph. The drawings and descriptions are meant to illuminate and clarify embodiments disclosed herein, and should not be considered limiting in any way. Like elements in different drawings may be indicated by like numerals. Elements in the drawings are not necessarily drawn to scale. In the drawings.

DETAILED DESCRIPTION

Embodiments disclosed herein teach inventive leakage-reducing structures, methods of fabricating such structures in the Ge—Si material system, and photo-devices based on such structures. The structures include certain doping profiles through a Ge seed layer and the underlying Si substrate. In general, this simple, highly efficient and low-cost method can be used when using a Ge seed and lateral overgrowth epitaxy on a Si substrate.

Figure 1A:
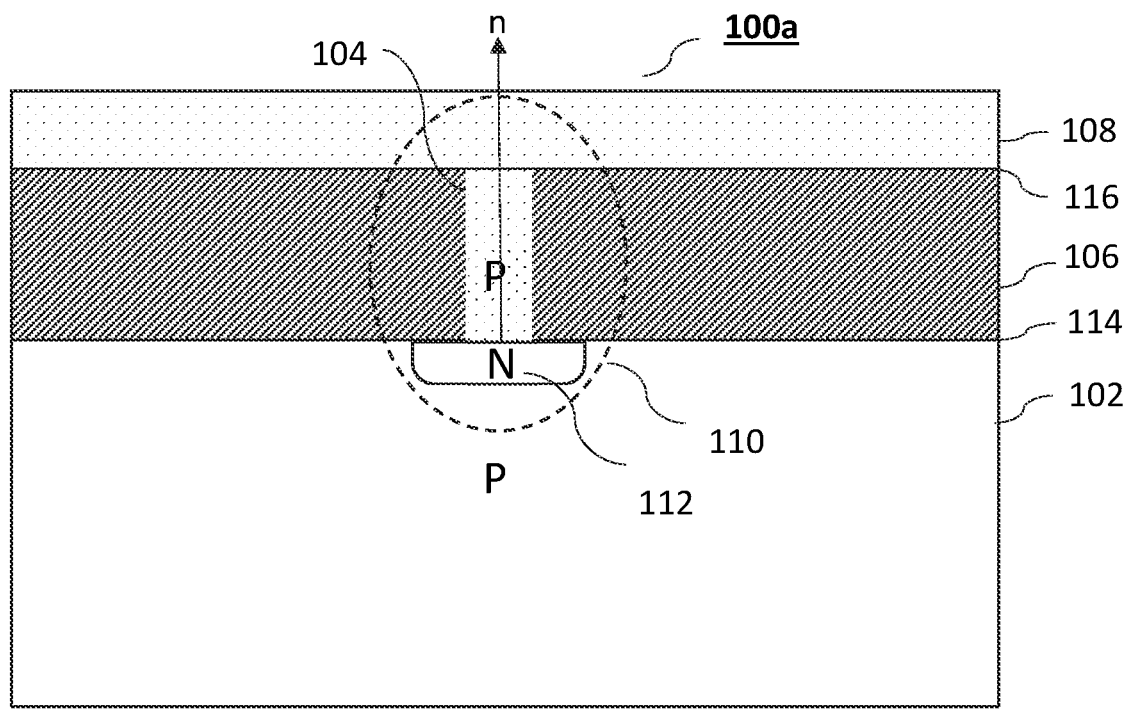
FIG. 1A illustrates schematically in a side view an embodiment of a Ge/locally doped Si/Si PNP structure disclosed herein.
Figure 1B:
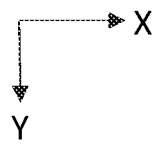
FIG. 1B illustrates schematically in a side view an embodiment of a Ge/locally doped Si/Si NPN structure disclosed herein.
Figure 1B:
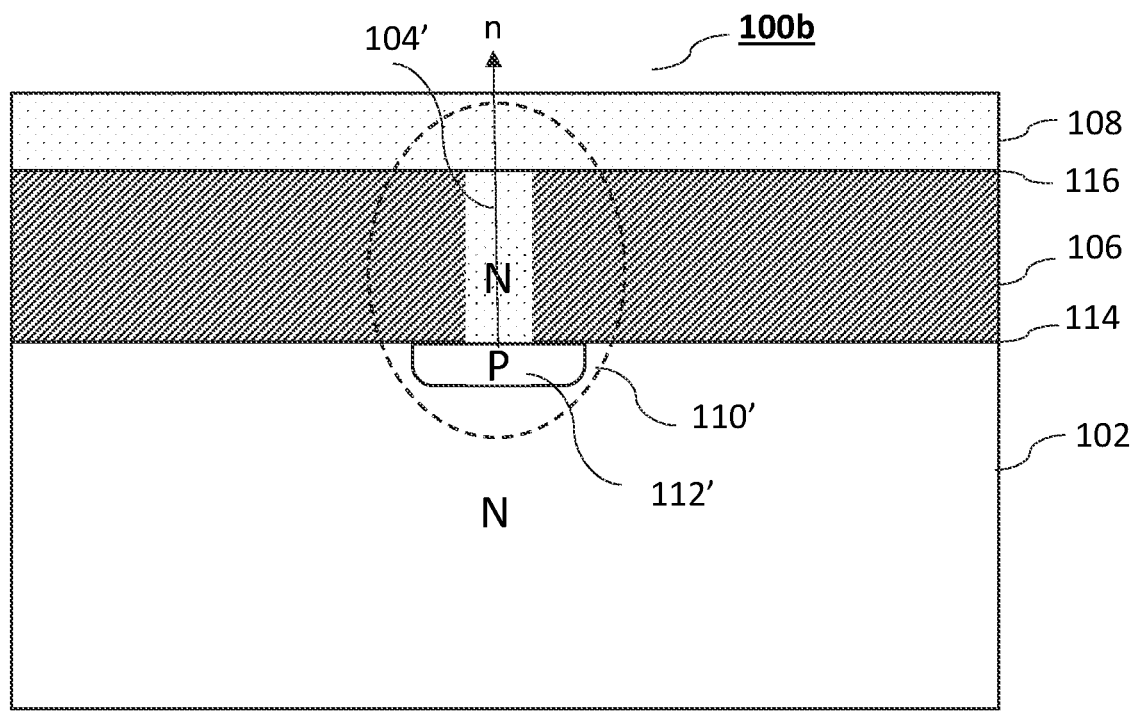

Referring now to the drawings, FIG. 1A illustrates schematically in a side view an embodiment of a Ge/locally doped Si/Si substrate structure numbered 100a disclosed herein. FIG. 1B illustrates schematically in a side view an embodiment of a Ge/locally doped Si/Si substrate structure numbered 100b disclosed herein. Structure 100a includes a Si substrate (or "layer") 102, a Ge seed layer 104 grown in an opening (e.g. etched region) of an insulator (dielectric) layer (e.g. $SiO_2$) 106 and a Ge epitaxial layer 108 laterally overgrown from the seed over the insulator layer to form a Ge-on-Si structure. Layer 102 is separated from layer 104 (and insulator 106) by an interface 114 and layer 104 (and insulator 106) is separated from layer 108 by an interface 116. Interfaces 114 and 116 share a plane normal "n". Structure 100a further includes locally, in a region marked by an oval 110, a locally n-doped doped Si region 112. In a vertical (Y according to the exemplary coordinate system) direction, oval 110 marks a structure comprising Ge seed 104 (and epitaxial layer 108) doped p-type, locally n-type doped Si region 112 and Si substrate 102 doped p-type. Therefore, the structure marked by oval 112 may be referred to as PNP structure 112.

Similarly, structure 100b has in a region marked by an oval 110' (also referred to as "locally doped region") and in a vertical (Y) direction, a NPN structure comprising Ge seed 104 (and epitaxial layer 108) doped n-type, a locally Si region 112' doped p-type and Si substrate 102 doped n-type. Therefore, the structure marked by oval 112' may be referred to as NPN structure 112'.

PNP structure 112 may be obtained for example as follows: starting with a p-type Si substrate 102, an intrinsic or doped Ge layer 108 is overgrown over insulator 106 from an p-type Ge seed layer 104. The p-type doping of the seed is formed using, for example, an in-situ doping method. The seed pattern is defined using standard lithography and etching in the dielectric layer. Prior to the Ge layer growth, locally n-type doped region 110 is formed in Si substrate 102 at the interface between the Ge seed and the Si wafer, for example, by ion implantation or diffusion. Given the ion implantation or diffusion conditions, the resulting doping profile of region 112 is known. An exemplary profile can be seen in FIG. 2A.

NPN structure 112' may be similarly obtained for example as follows: starting with a n-type Si substrate 102, an intrinsic or doped Ge layer 108 is overgrown over insulator 106 from a n-type Ge seed layer 104. The n-type doping of the seed is formed using, for example, an in-situ doping method. The seed pattern is defined using standard lithography and etching in the dielectric layer. Prior to the Ge layer growth, locally p-type doped region 112' is formed in Si substrate 102 at the interface between the Ge seed and the Si wafer, for example, by ion implantation or diffusion. Given the ion implantation or diffusion conditions, the resulting doping profile of region 112' is known. An exemplary profile can be seen in FIG. 2B.

The doping levels (dopant concentrations) of the layers in PNP structure 112 or NPN structure 112' may vary as follows: the doping (P or N) of the Si substrate may vary between $1\times10^{18}$ cm$^{-3}$ and $1\times10^{17}$ cm$^{-3}$, the doping (N or P) of locally doped region 112 or 112' may vary between $1\times10^{17}$ cm$^{-3}$ and $1\times10^{19}$ cm$^{-3}$ and the doping (P or N) of the Ge seed may vary between $1\times10^{16}$ cm$^{-3}$ and $1\times10^{18}$ cm$^{-3}$. In a non-limiting example, the locally doped region thickness may be about 100 nm.

In a particular and non-limiting example of a PNP structure 112, Si substrate 102 may be p-type doped with boron to a level of about $1\times10^{15}$ cm$^{-3}$, locally doped Si region 112 may be n-type doped with phosphor or arsenic to a level of about $1\times10^{18}$ cm$^{-3}$ and Ge seed 104 may be p-type doped with boron, gallium or aluminum to about a level of $1\times10^{17}$ cm$^{-3}$.

In a particular and non-limiting example of a NPN structure 112, Si substrate 102 may be n-type doped with arsenic or phosphor to a level of about $1\times10^{15}$ cm$^{-3}$, locally doped Si region 112 may be p-type doped with boron, gallium or aluminum to a level of about $1\times10^{18}$ cm$^{-3}$ and Ge seed 104 may be n-type doped with arsenic or phosphor to about a level of $1\times10^{17}$ cm$^{-3}$.

Figure 2A:
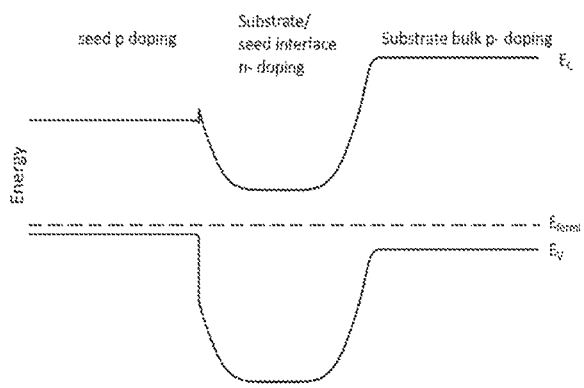
FIG. 2A illustrates schematically an energy band profile of the structure in FIG. 1A.
Figure 2B:
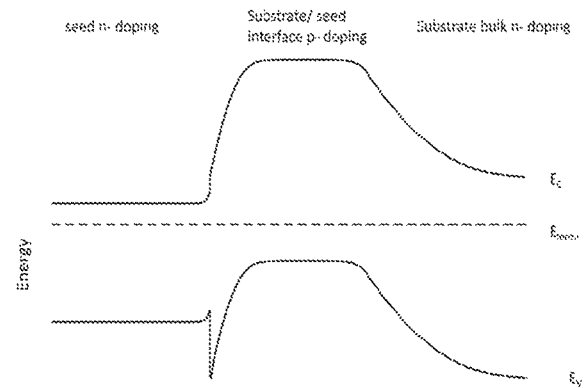
FIG. 2B illustrates schematically an energy band profile of the structure in FIG. 1B.

FIG. 2A illustrates schematically an energy band profile of the PNP structure in FIG. 1A, and FIG. 2B illustrates schematically an energy band profile of the NPN structure in FIG. 1B. The energy bands are similar to those of heterojunction BJTs, except in this case a BJT structure is formed only locally in the Ge seed region and the Si substrate. The term "substrate/seed interface" in these figures is equivalent to the "locally doped region" mentioned above and below. The resulting band structure is instrumental for reducing the leakage current through the seed layer into the Si substrate by forming two opposite PN junctions. Specifically, there will always be an energy barrier for the carriers such that the carriers cannot be transported from the Ge seed to the silicon substrate and vice versa. This is true for zero bias between the silicon substrate and the Ge seed as well as for a between bias the silicon and the Ge seed. The voltage drops on such a structure always have one junction in reverse bias mode, a feature used to block unnecessary leakage current.

Figure 3:
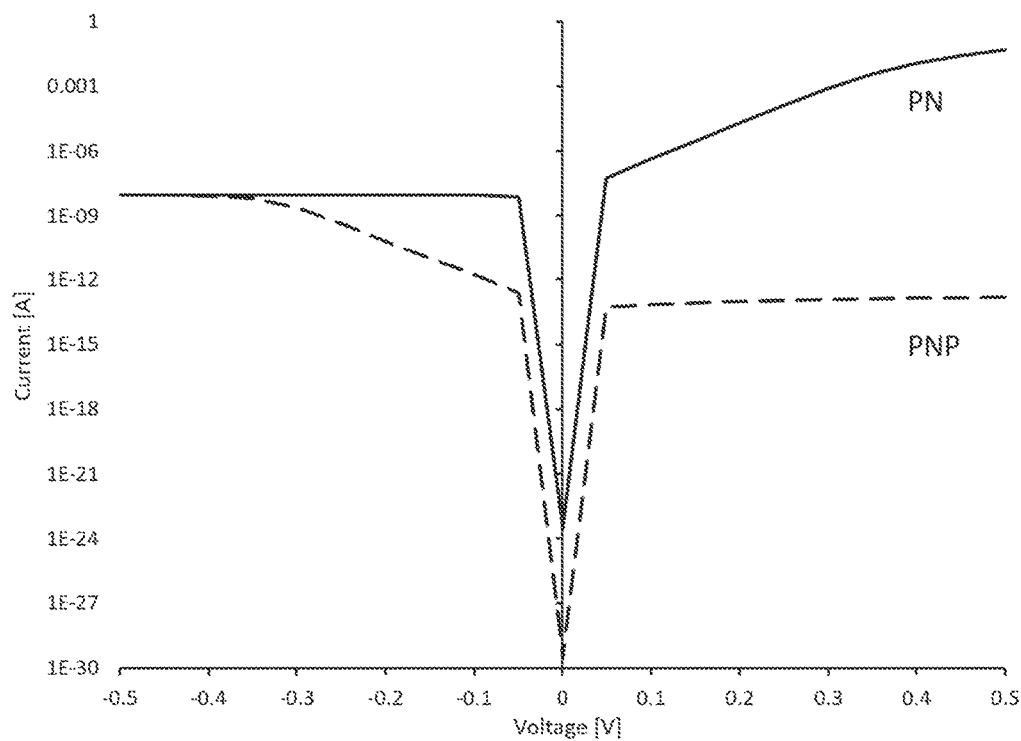
FIG. 3 illustrates schematically a typical current transport in NPN and PNP structure disclosed herein.

FIG. 3 illustrates simulated transport current through an example of a PNP structure like structure 100a. The structure is doped as follows: The Si substrate is p-type doped to a level of $1\times10^{15}$ cm$^{-3}$, the locally doped Si region is n-type doped to a level of $1\times10^{18}$ cm$^{-3}$, and the Ge seed is p-type doped to a level of $1\times10^{17}$ cm$^{-3}$. The obtained current is compared to that of a Si/Ge PN junction consisting of p-type Si (doping of $1\times10^{15}$ cm$^{-3}$) and n-type Ge region having doping of $1\times10^{18}$ cm$^{-3}$. The simulated current through the PNP device shows reduced leakage current. For example, for a positive voltage (bias) of 0.1V, there is reduction of almost 7 orders of magnitude in the leakage current. Bias" refers to the difference in electric potential between the Ge and the Si substrate. For a positive 0.5V bias, the reduction is even higher, about 10 orders of magnitude. For a negative bias of −0.1V there is improvement of about 3 orders of magnitude. For a higher negative bias of about −0.3V the improvement becomes negligible. "Moreover, if the seed (104) and the substrate (102) have the same level of doping without the additional layer (i.e. without the locally doped region 112 or 112'), e.g. pp or nn doping, the leakage current through the seed is expected to be higher and will most likely reduce the device performance.

Figure 4:
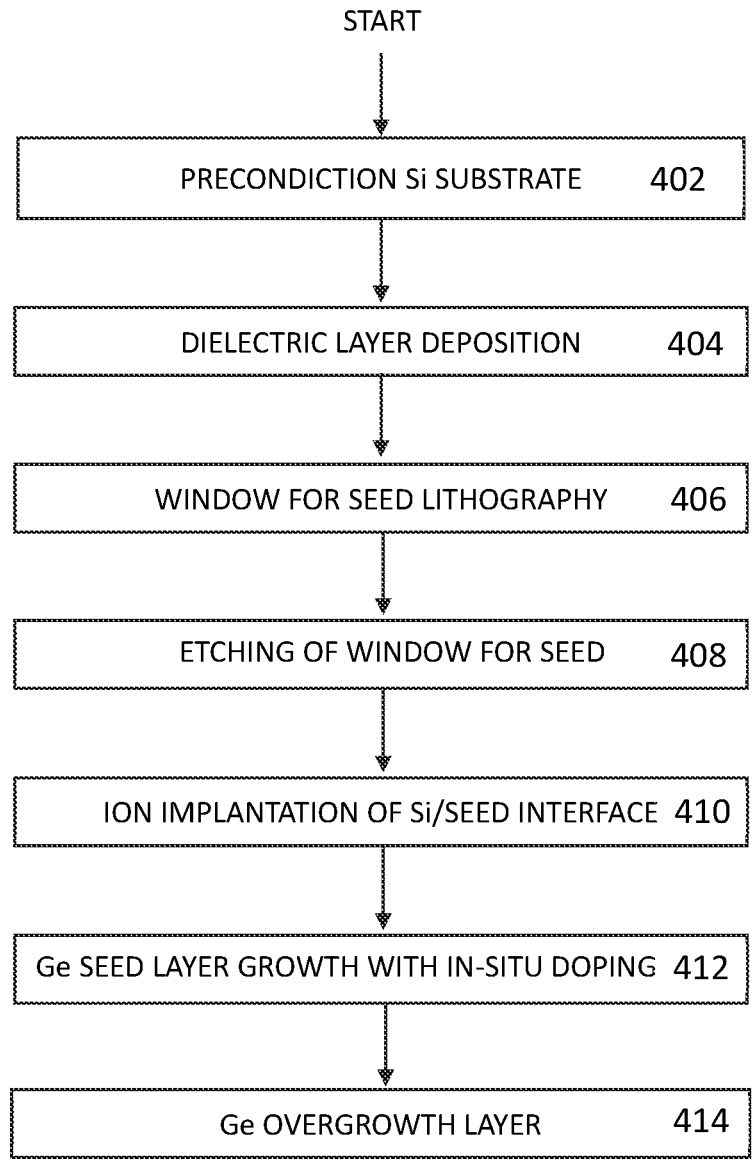
FIG. 4 shows a flow diagram of an exemplary and non-limiting embodiment of a process for fabricating a structure as in FIGS. 1A and 1B.

FIG. 4 shows a flow diagram of an exemplary and non-limiting embodiment of a process (method) for fabricating a structure such as 100a or 100b with a desired local PNP or NPN doping profile. The process starts at step 402 with a preconditioned doped Si substrate (also referred to as "layer") serving as the carrier wafer for the epitaxy growth process. The preconditioning can include for example cleaning or adding a protection layer. A dielectric (insulator) layer, for example $SiO_2$, is deposited on the Si wafer in step 404. A standard lithography process defines a window in the dielectric layer in step 406 and the window is etched into the dielectric layer all the way through the dielectric layer to reach the Si wafer in step 408. An ion implantation process followed by dopant activation (e.g. using rapid thermal annealing or diffusion) is used to form the locally doped region 112 or 112' in the silicon in step 410. The doping type is opposite to the doping of the Si wafer. For example, in a PNP structure, starting with a Si wafer doped to a level of $1\times10^{15}$ cm$^{-3}$ with boron, the n-type locally doped region may be formed by implantation of phosphor at 30 KV and dose of $2\times10^{13}$ ions/cm$^2$, followed by diffusion of about 10 minutes at 1020° C. Subsequently, in step 412, the Ge seed is grown in the window with in-situ doping identical to that of the Si wafer. The in-situ doping provides a uniformly doped seed layer. Finally, an intrinsic or doped Ge epitaxial layer 108 is overgrown over the insulator from the seed in step 414.

Figure 5:
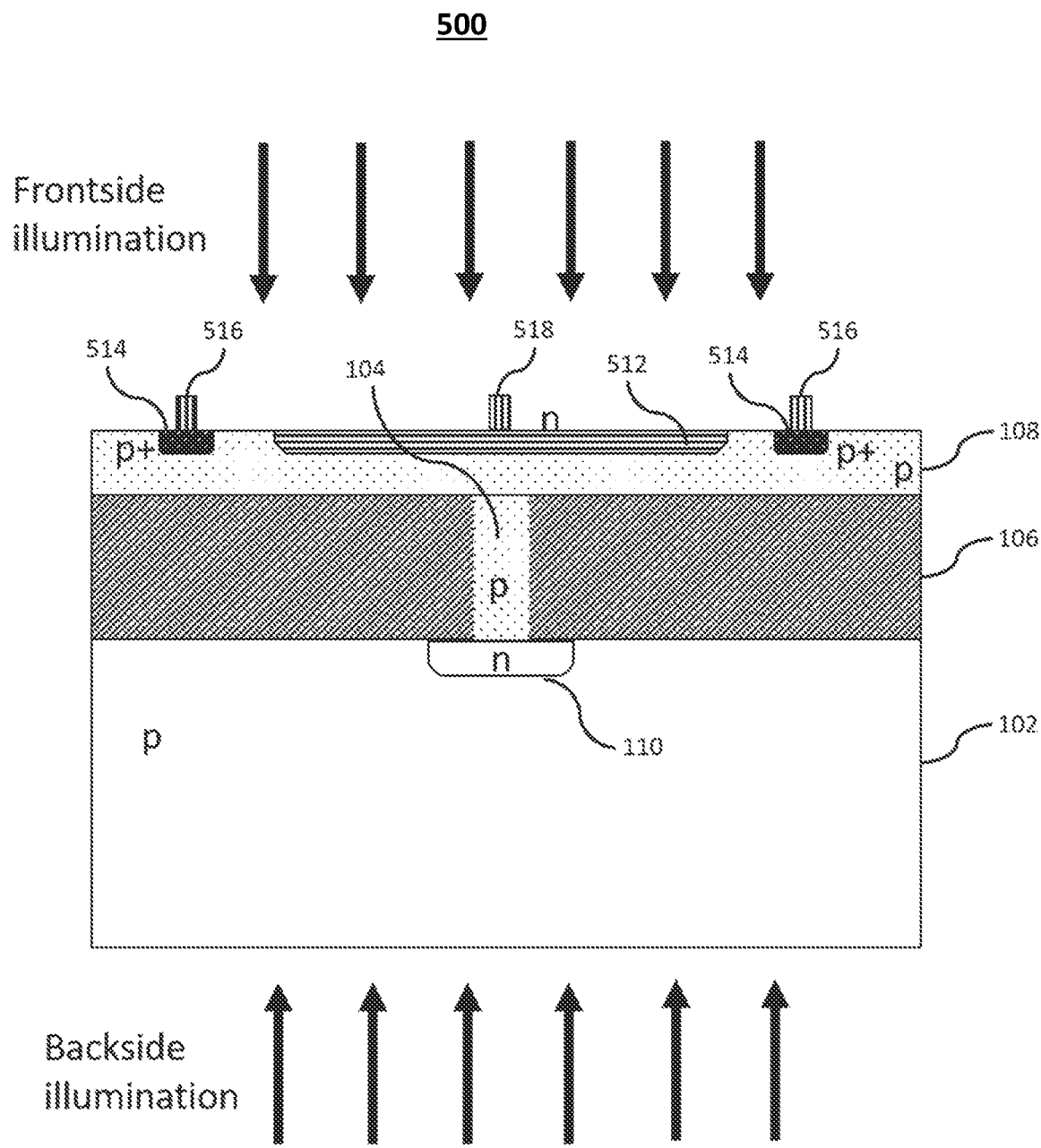
FIG. 5 shows an exemplary photodiode fabricated in a structure as in FIG. 1A.

FIG. 5 shows an exemplary photodiode numbered 500 fabricated in a structure of Ge grown on a Si substrate by the seed layer technique. The structure is similar to that in FIG. 1A, with the addition of a n-doped region 512, p+ doped regions 514 and electrical contacts 516 and 518, which form exemplary biasing means for the PD. Light can arrive in both back-side illumination or front-side illumination, as shown. In general, the direction of the light entering the PD is substantially parallel to the Y axis, up to an acceptance angle of optics (not shown) coupled to the PD.

Photodiodes like PD 500 can be formed as (arranged in) an array (not shown), and be integrated with a standard read out circuitry (ROIC) to form a CMOS type imager.

Unless otherwise stated, the use of the expression "and/or" between the last two members of a list of options for selection indicates that a selection of one or more of the listed options is appropriate and may be made.

It should be understood that where the claims or specification refer to "a" or "an" element, such reference is not to be construed as there being only one of that element.

While this disclosure has been described in terms of certain embodiments and generally associated methods, alterations and permutations of the embodiments and methods will be apparent to those skilled in the art. The disclosure is to be understood as not limited by the specific embodiments described herein, but only by the scope of the appended claims.

What is claimed is:

1. A semiconductor structure, comprising:
   a) a silicon (Si) substrate, a Germanium (Ge) seed layer and a Ge epitaxial layer separated by respective interfaces that share a common plane normal, wherein the Si substrate and the Ge seed layer have a same first doping type with a first doping level; and
   b) a locally doped region formed in the Si layer adjacent to the Ge seed layer and having a second doping type with a second doping level, wherein the locally doped region is designed to reduce leakage currents between the Si substrate and the Ge epitaxial layer when an electrical bias is applied to the structure.

2. The semiconductor structure of claim 1, wherein the first doping type is n-type and wherein the second doping type is p-type.

3. The semiconductor structure of claim 1, wherein the first doping type is p-type and wherein the second doping type is n-type.

4. The semiconductor structure of claim 1, wherein the Ge epitaxial layer has a doping type that is the same as the first doping type.

5. The semiconductor structure of claim 1, wherein the Ge epitaxial layer has intrinsic doping.

6. The semiconductor structure of claim 1, wherein the second doping level is higher than the first doping level.

7. An optoelectronic device, comprising:
   a) a silicon (Si) substrate, a Germanium (Ge) seed layer and a Ge epitaxial layer separated by respective interfaces that share a common plane normal, wherein the Si substrate and the Ge seed layer have a same first doping type with a first doping level;

b) a locally doped region formed in the Si layer adjacent to the Ge seed layer and having a second doping type with a second doping level, wherein the locally doped region is designed to reduce leakage currents between the Si substrate and the Ge epitaxial layer when an electrical bias is applied to the structure; and c) biasing means for applying the electrical bias between the Si substrate and the Ge epitaxial layer.

8. The optoelectronic device of claim 7, wherein the first doping type is n-type and wherein the second doping type is p-type.

9. The optoelectronic device of claim 7, wherein the first doping type is p-type and wherein the second doping type is n-type.

10. The optoelectronic device of claim 7, wherein the Ge epitaxial layer has a doping type that is the same as the first doping type.

11. The optoelectronic device of claim 7, wherein the Ge epitaxial layer has intrinsic doping.

12. The optoelectronic device of claim 7, wherein the second doping level is higher than the first doping level.

13. A method, comprising: forming a structure a silicon (Si) substrate, a Germanium (Ge) seed layer and a Ge epitaxial layer separated by respective interfaces that share a common plane normal, wherein the Si substrate and the Ge seed layer have a same first doping type with a first doping level, and a locally doped region formed in the Si layer adjacent to the Ge seed layer and having a second doping type with a second doping level, wherein the locally doped region is designed to reduce leakage currents between the Si substrate and the Ge epitaxial layer when an electrical bias is applied to the structure.

14. The method of claim 13, further comprising forming biasing means for applying the electrical bias between the Si substrate and the Ge epitaxial layer.

15. The method of claim 13, wherein the first doping type is n-type and wherein the second doping type is p-type.

16. The method of claim 13, wherein the first doping type is p-type and wherein the second doping type is n-type.

17. The method of claim 13, wherein the Ge epitaxial layer has a doping type that is the same as the first doping type.

18. The method of claim 13, wherein the Ge epitaxial layer has intrinsic doping.

19. The method of claim 13, wherein the second doping level is higher than the first doping level.

* * * * *